US006448130B1

(12) United States Patent
Kim

(10) Patent No.: US 6,448,130 B1
(45) Date of Patent: Sep. 10, 2002

(54) METHOD OF SELECTIVELY FORMING SILICIDE FILM OF MERGED DRAM AND LOGIC

(75) Inventor: Myoung-Soo Kim, Suwon (KR)

(73) Assignee: Samsung Electronics Co. Ltd. (KR)

( * ) Notice: Subject to any disclaimer, the term of this patent is extended or adjusted under 35 U.S.C. 154(b) by 0 days.

(21) Appl. No.: 09/941,345

(22) Filed: Aug. 29, 2001

(30) Foreign Application Priority Data

Feb. 12, 2001 (KR) .......................................... 2001-6678

(51) Int. Cl.[7] .......................................... H01L 21/8247
(52) U.S. Cl. ........................ 438/241; 438/210; 438/656
(58) Field of Search ................................ 438/210, 241, 438/253, 396, 592, 655, 656

(56) References Cited

U.S. PATENT DOCUMENTS 6,015,748 A 1/2000 Kim et al. .................. 438/592
6,162,675 A * 12/2000 Hwang et al. .............. 438/241
6,291,279 B1 * 9/2001 Hsiao et al. ................ 438/210

* cited by examiner

*Primary Examiner*—Chandra Chaudhari
(74) *Attorney, Agent, or Firm*—Mills & Onello LLP

(57) ABSTRACT

Disclosed is a method of selectively forming a silicide film of merged DRAM logic by which active regions of a logic side are entirely changed into a silicidation state without adding a separate photoresist patterning process even though there exist any regions in which the space between gates is somewhat narrower than in a DRAM cell forming region, and an etch stopper film of SiON material that is needed in the formation of deep contacts can be applied to a MDL process having dual gate in mass production.

14 Claims, 6 Drawing Sheets

118
116
110
108
102
106
104
100
A
118
106
104
102
100
B

METHOD OF SELECTIVELY FORMING SILICIDE FILM OF MERGED DRAM AND LOGIC

BACKGROUND OF THE INVENTION

1. Field of the Invention

The present invention relates to a method of fabricating semiconductor devices and, more particularly, to a method of selectively forming silicide film of merged DRAM and LOGIC (MDL) having a dual gate.

2. Description of the Related Art

As the degree of integration of semiconductor devices increases, a combined chip (for example, MDL) in which memory cells (DRAM cells) and logic circuits are merged into a chip has been created in compliance with a user's various requirements as a preliminary step in forming a system on a chip. Since the combined chip of MDL is fabricated in such a manner that separate memories and logic are integrated in one chip, it has merits such as miniaturization, lower waste of electric power, higher speed, and realization of electromagnetic interference noise (EMI). Accordingly, many attempts to study and develop it have actively been made in many fields.

In the fabrication of MDL, the silicide film is formed throughout the whole region of a semiconductor device (for example, gate electrode and active regions in which DRAM cells are formed and a logic circuit region in which logic circuits are formed) in order to lower the resistance of the active region, gate electrode, and contact, thereby increasing operation capability in terms of device current and decreasing dependence of device characteristics on contact layout. Such a fabrication method is intended to prevent signal delays due to RC time constants, power consumption increase and degradation in high-speed operation, all of which can be caused by increases in contact and sheet resistance due to the reduction in the line width of gate electrodes and contact size as the degree of integration of the MDL chip is increased.

However, in the event that the silicide film is formed throughout the whole region of a semiconductor device, the junction leakage in a memory cell region (particularly, in an active region in which the storage node of cell capacity is formed) increases due to the silicide film formed in the active region of DRAM forming region, thereby decreasing the capability in data storage and lowering the refresh characteristic of the DRAM cell.

In order to solve such a problem, there was recently suggested a method by which the silicide film is selectively formed in a gate electrode region and an active source region of the logic circuit forming region (source and drain regions) only. Under this approach, the silicide film is not formed in the DRAM forming region.

There are various methods for selectively forming a silicide film in a specific region only. The most commonly used method includes formation of a silicide blocking layer (hereinafter, referred to as SBL) in a region other than the region in which a silicide film is formed. A silicide film is selectively formed in the region that does not include the SBL using a photolithography process of critical level. However, this method causes various difficulties such as reduced process margins in both the SBL and silicide film caused by misalignment in the etching process. As a result, there is an increasing trend to fabricate the MDL is utilizing a new selective silicidation process which results in improvement over the conventional method.

FIGS. 1*a* to 1*d* illustrate this method, i.e., the sequential steps for selectively forming the silicide film of an MDL having a dual gate. In the drawings, reference "A" indicates a DRAM forming region and "B" indicates a logic forming region.

Referring to FIG. 1*a*, in a first step, an undoped polysilicon film is deposited on a semiconductor substrate (silicon) 10 that is formed with shallow trench isolation (STI) 12. The polysilicon film is doped with a low concentration of impurity by ion-implanting a low concentration of impurity into the film to the degree that the DRAM cell transistor can operate. Next, the polysilicon film is selectively etched utilizing a mask of a resist pattern that limits the gate electrode-forming region so that a gate 14 is formed on each of the DRAM cell forming region A and logic circuit forming region B. Then, the lightly doped drain (LDD) region (not shown) is formed on the substrate 10 within both edge sides of the gate. Subsequently, an insulating spacer 16 is formed on each of the sidewalls of the gate 14. Thereafter, the resist pattern is formed in the DRAM forming region A so that the logic-forming region B is opened. With the resist pattern as a mask, a high concentration of N type impurity ($N^+$ type) is ion-implanted into the NMOS transistor forming region on the resultant material and a high concentration of P type impurity ($P^+$ type) is ion-implanted into the PMOS transistor forming region. The resist pattern is then removed. As a result, in the logic circuit forming region B, the NMOS forming region is formed thereon with the N+ type gate and the N+ type source/drain regions having a LDD structure, and the PMOS forming region is formed thereon with the P+ type gate and the P+ type source/drain regions having a LDD structure.

As shown in FIG. 1*b*, a nitride film 18 for SBL is formed on the substrate 10 that is formed therein with the gate 14 and the spacer 16, and the oxide film 20 for SBL of USG material is formed on the nitride film 18 to a thickness of approximately 2500 Å with reference to the upper surface of the gate 14. Thereafter, the oxide film 20 is dry-etched using a blanket etch-back process. At this time, the oxide film is dry-etched to a thickness of approximately 3100 Å with reference to the active region on the substrate. As a result, in the DRAM cell forming region A in which the gap between the gates is very narrow, the oxide 20 remains at a thickness as much as the active region is sufficiently filled. In the logic circuit forming region B in which the gap between the gates 14 is broad, the oxide 20 remains at a thickness less than in the DRAM forming region A side. The reason that a part of the oxide film 20 for SBL is first dry-etched is to reduce the time that takes in etching the oxide film 20 in a following wet-etch back process.

As shown in FIG. 1*c*, the oxide film 20 is etched back by a wet-etching method so that the nitride film 18 for SBL on the gate 14 may be exposed. Thereby, the oxide film 20 for SBL remains with a thickness of several hundred Å by self-alignment just in the active region of the DRAM cell forming region A where the space between the gates is narrow.

The reason that the oxide film 20 remains in only the active region of the DRAM cell forming region A is that, since the active region (source/drain regions) of the logic circuit forming region B is wider in its size than the active region of the DRAM cell forming region A, the oxide film 20 in the logic circuit forming region B is entirely removed. In contrast, the oxide film 20 in the DRAM cell forming region A is not entirely removed.

As shown in FIG. 1*d*, the nitride film 18 for SBL in the other region excluding the region in which the oxide film 20 remains is dry-etched, thereby exposing the silicide film forming region (for example, the gate surface of the DRAM cell forming region, the gate surface of the logic circuit forming region, and the surface of the active region). Refractory metals such as Co, Ti, Ni are deposited on the resultant material and are heat treated. At this time, the silicon and the refractory metals react and the silicide film 22 of low resistance is formed in the oxide film-removed region. In contrast, the silicon and the refractory metal cannot react and the refractory metal accordingly remains in an un-reacted state in the oxide-remained region or the spacer formed region. Subsequently, the refractory metal that remain is removed using sulfuric acid.

This conventional selective silicide film forming process causes several problems in fabricating a semiconductor devices. First, where the device is deigned so that all the active regions of the logic circuit forming region B may have larger sizes than those of the DRAM cell forming region A, there is no problem. However, where the device is deigned so that part of the active regions (for example, which are used just as an active region between the gates regardless of the formation of contact) of the logic circuit forming region B may partly have smaller sizes than those of the DRAM cell forming region A, there is a problem that silicide film is defectively formed in such part. In order to solve such problems, before the silicide forming process is performed, a photolithography process should additionally be performed so that any remained oxide film in the logic circuit forming region B may entirely be removed. Where this is done, the entire process becomes very complicated and expensive.

Second, as DRAMs have been scaled down in size, capacitors of the DRAM cell, in the case of MDL, show a tendency to have a stack structure. Accordingly, a region in which a logic circuit is to be formed in a following process inevitably requires an additional deep contact forming process. In this case, since the contact hole to be formed is too deep, it is difficult to form the deep contact in the logic side just with the target etching process. Accordingly, PE-SiON film, which is an etch stopper, is needed. However, if PE-SiON deposition is added to the underlying structure shown in FIG. 1*d*, although there is no problem in forming contact holes in the logic side, the etching processes become very complicated in forming direct contact (DC) or buried contact (BC) in the DRAM side due to multiple layered films (for example, nitride film for SBL/oxide film for SBL/PE-SiON film for etch stopper) having etching rates different from each other that are remained in an active region. Moreover, since the amount of the remained oxide film 20 is not regular every gate spaces, a not-open phenomenon may occur while DC or BC is formed. Accordingly, the currently MDL forming process cannot employ the etch stopper film.

SUMMARY OF THE INVENTION

Accordingly, it is an object of the present invention to provide a method of selectively forming a silicide film of MDL by which an active region in a logic circuit side can be entirely covered with silicide film by employing an organic anti-reflective coating (ARC) having an excellent planarization characteristic without an additional photolithography process, even if space between gates is somewhat narrower in one or more regions, including the logic circuit forming region, than in a DRAM forming region.

It is another object of the present invention to provide a method of selectively forming a silicide film of MDL by which an etch stopper film of SiON material that is used to secure a contact hole having a high aspect ratio can be applied to a process for forming a MDL having a dual gate.

In order to achieve the objects, a method of selectively forming silicide film of MDL is provided. In accordance with the method, gates are formed provided with an insulating spacer in each of the DRAM forming region and the logic circuit forming region on a substrate. A high concentration of impurities is ion implanted selectively to form source/drain regions into only the logic circuit forming region on the substrate. A first oxide film for SBL and a nitride film for SBL are deposited in order on the resultant material. The nitride film for SBL is coated with a predetermined film having a constant thickness. An insulating film is formed in the logic circuit forming region on the predetermined film. The predetermined film that is not masked by the insulating film in the DRAM cell forming region is removed. A second oxide film for SBL is deposited on the resultant material. The second oxide film is etched back so that in the active regions between the gates of the DRAM cell forming region, the second oxide film for SBL that has a lower step coverage than the gate remains, and in the logic circuit forming region, the predetermined film is exposed. The residual predetermined film in the logic circuit forming region is removed. The nitride film for SBL and the first oxide film for SBL exclusive of the active region of the DRAM cell forming region in which the second oxide film for SBL remains are etched in order so that the gate surface of the DRAM cell forming region, the gate surface and the surface of the active region in the logic circuit forming region are exposed. A silicide film is formed on each of the gate and the active region, the surfaces of which are exposed.

It is desirable that the first oxide for SBL be formed of a medium temperature oxide material, and that the second oxide film for SBL be formed of USG material, and that the predetermined film be formed of an organic ARC having a thickness of 300 to 4000 Å.

The second oxide film for SBL that remains in the active region of the DRAM cell forming region may be removed together when the first oxide film for SBL is etched for the formation of the deep contact of the logic circuit side.

In the event that the silicide film is formed as described above, since the predetermined film that fills the gap between the gates is regular in its thickness without regard to whether the active region is narrow or broad, all of the surfaces of the active region and the gate in the logic circuit forming region can be opened through the processes of removing the predetermined film and the first and second oxide films for SBL that are performed after the deposition of the oxide film of USG material and the etch back process thereto, thereby preventing the defect that the silicide film is partly not formed in the active region of the logic forming region.

Furthermore, if the second oxide film for SBL that remains in the active region of the DRAM cell forming region is just removed together when the first oxide film is etched, there is no problem even though the etch stopper film of SiON material is applied to the formation of the deep contact because it is performed at the state that any oxide films of the DRAM cell forming region and the logic circuit forming region be removed.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

Figure 1A:
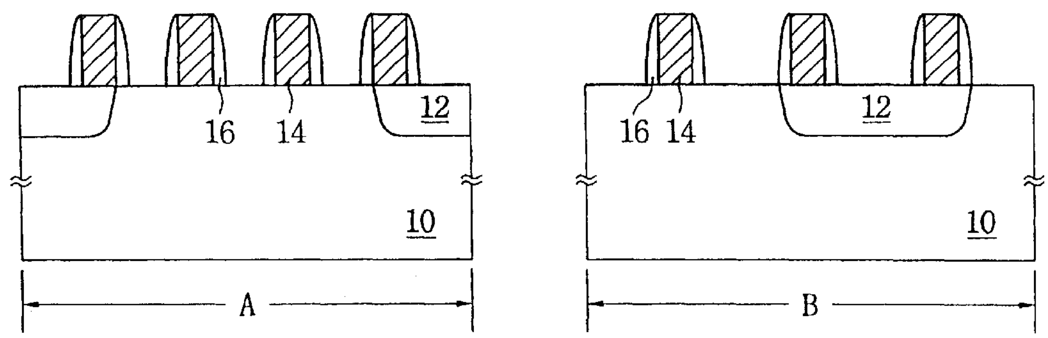
FIGS. 1*a* through 1*d* are schematic cross-sectional views sequentially illustrating processes for selectively forming silicide films of MDL having a conventional dual gate.
Figure 1B:
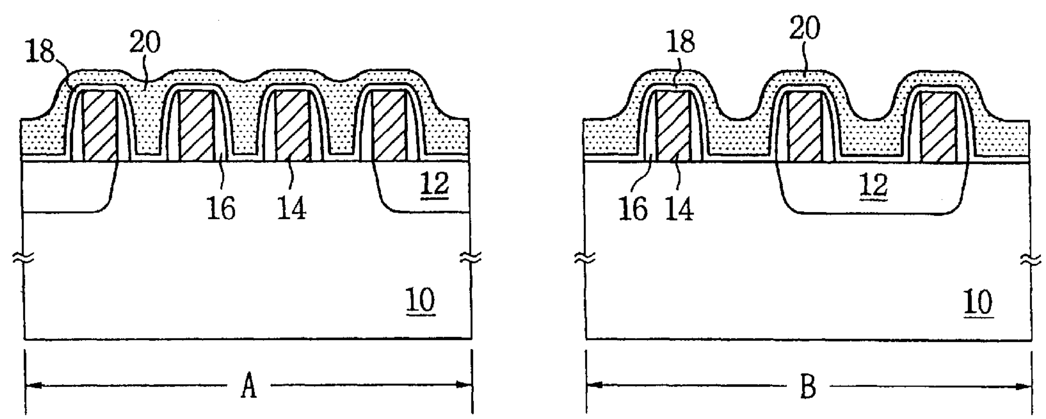
Figure 1C:
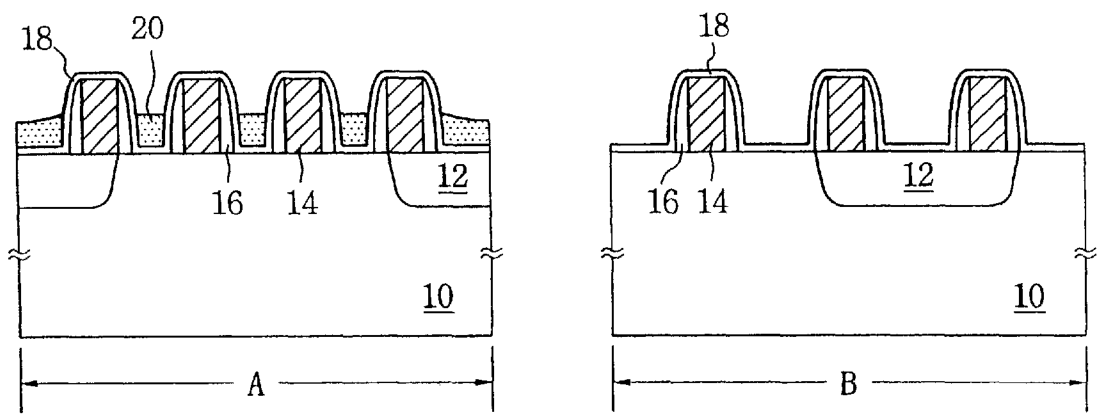
Figure 1D:
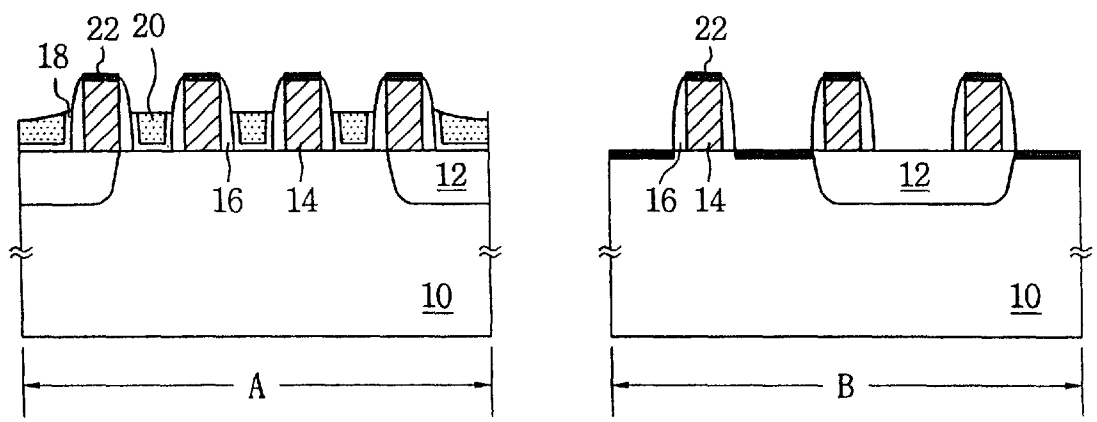

Hereinafter, the preferred embodiment will be described in detail with reference to the accompanying drawings. FIGS. 2*a* through 2*i* are views sequentially illustrating processes for selectively forming silicide films of MDL having a dual gate according to the present invention. In the drawings, the letter "A" indicates the DRAM cell forming region and "B" indicates the logic circuit forming region.

Figure 2A:
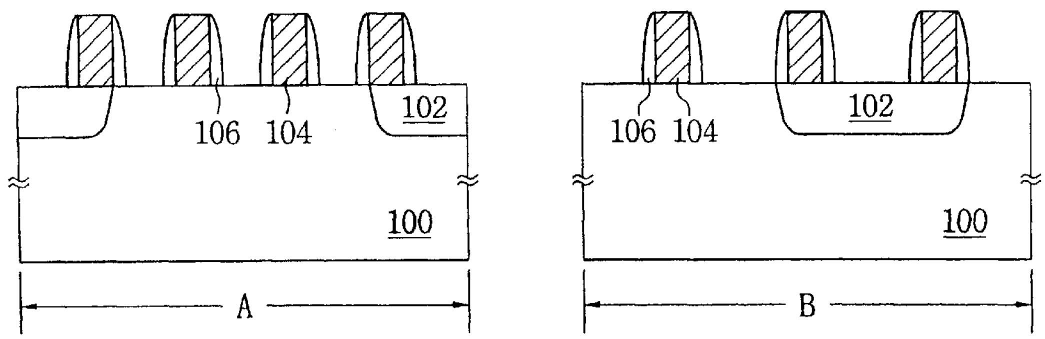
FIGS. 2*a* through 2*i* are schematic cross-sectional views sequentially illustrating processes for selectively forming silicide films of MDL having a dual gate according to the present invention.

As illustrated in FIG. 2*a*, in a first step, an undoped polysilicon film is deposited on the semiconductor substrate, e.g, a silicon substrate, 100 provided with STI 102. Next, a low concentration of impurity is ion-implanted into the polysilicon film in such a configuration as to be applicable to an operable DRAM cell transistor. The polysilicon film is selectively etched using a photo-resist pattern as a mask that defines the gate electrode forming region, thereby forming a gate 104 on each of the DRAM cell forming region A and the logic circuit forming region B.

The LDD region (not shown) is subsequently formed on the substrate 100 of both edge sides of the gate and the insulating spacer 106 is formed on both side walls of the gate 104. Thereafter, the resist pattern is formed in the DRAM cell forming region A so that the logic circuit forming region B is opened. A high concentration of N type of impurities ($N^+$ type) are ion-implanted into the NMOS transistor forming region on the resultant material, a concentration of P type of impurities ($P^+$ type) are ion-implanted into the PMOS transistor forming region, and then the resist pattern is removed. As a result, in the NMOS forming region of the logic circuit forming region B, N+ type source/drain regions and N+ type gates are formed in a LDD structure, and in the PMOS forming region, P+ type source/drain regions and P+ type gates are formed in a LDD structure.

Figure 2B:
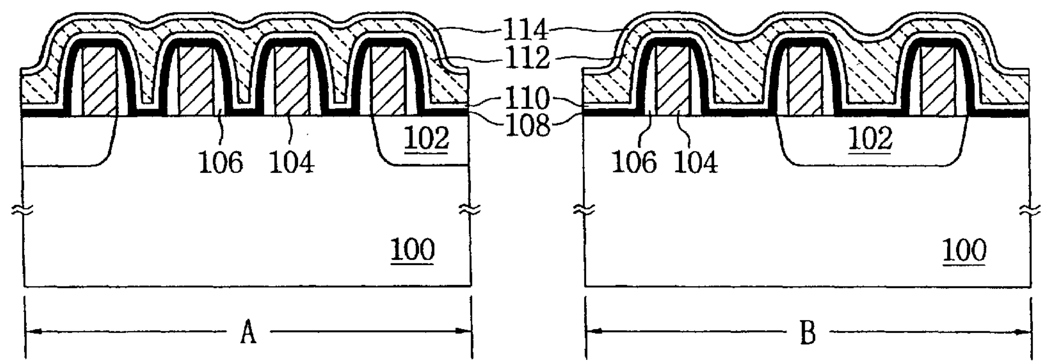

As shown in FIG. 2*b*, the first oxide film 108 of medium temperature oxide (MTO) material for SBL is formed on the substrate 100 including the gate 104 and the spacer 106, and the nitride film 110 for SBL is deposited on the resultant surface. The predetermined film 112 of an organic ARC material, which has an excellent planarization characteristic and is independent of the underlying layer thereof, is formed at a thickness of 300 through 4000 Å. In this procedure, since the active regions between the gates 104 are filled with the predetermined film 112 having a relatively regular thickness regardless of whether the size of the active region is narrow or broad, the film can be remarkably planarized. In addition, the insulating film 114 of PEOX or USG material is formed on the predetermined film 112 in order to form patterns for the distinction between the DRAM cell forming region A and the logic circuit forming region B.

Figure 2C:
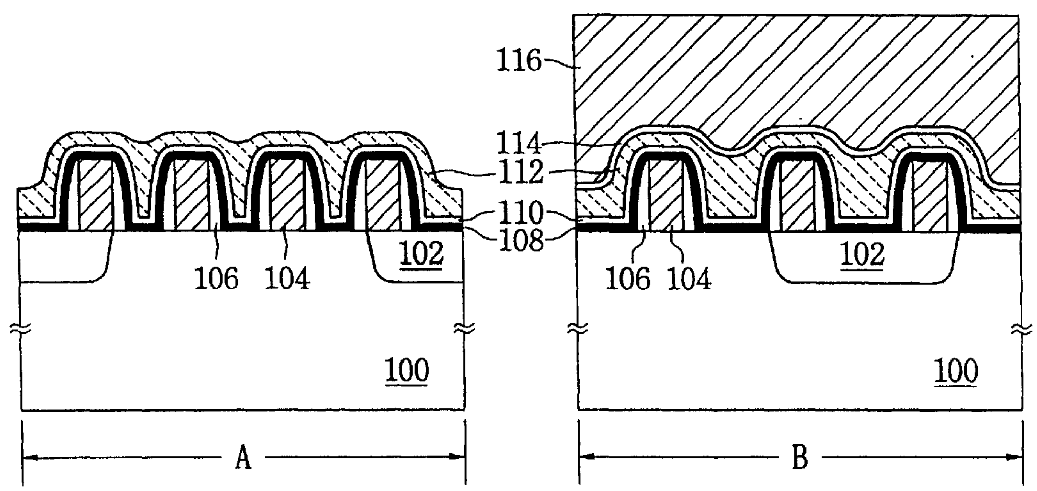

As shown in FIG. 2*c*, the photoresist pattern 116 is formed on the insulating film 114 so that the DRAM cell forming region A is opened, and is used as a mask to remove the insulating film 114 of the DRAM cell forming region A.

Figure 2D:
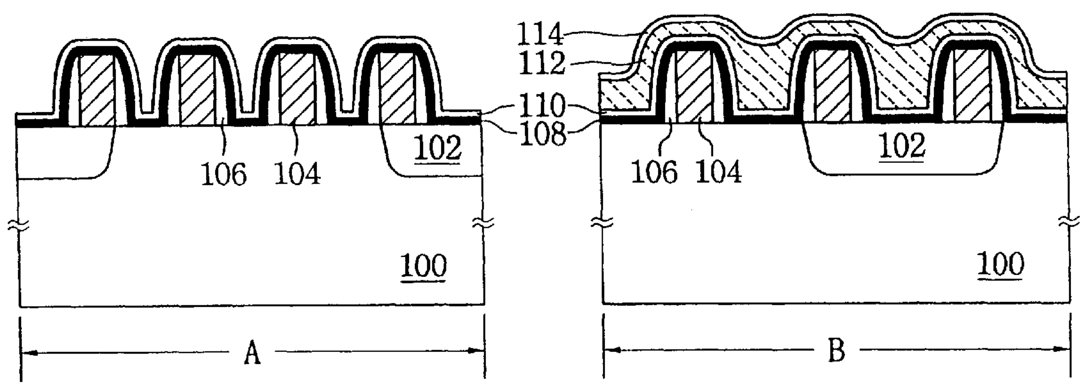

As shown in FIG. 2*d*, the photo-resist pattern 116 of the logic circuit forming region B is removed via the ashing and strip processes. In the ashing process, the exposed predetermined film 112 of the DRAM cell-forming region A is also removed because the organic ARC can easily be removed by the ashing process like the photo-resist. As a result, the first oxide film for SBL/nitride film 110 for SBL only remain in the DRAM cell forming region A. In contrast, the multi-layered film of the first oxide film 108 for SBL/ nitride film 110 for SBL/predetermined film 114/insulating film 112 remain in the logic circuit forming region.

Figure 2E:
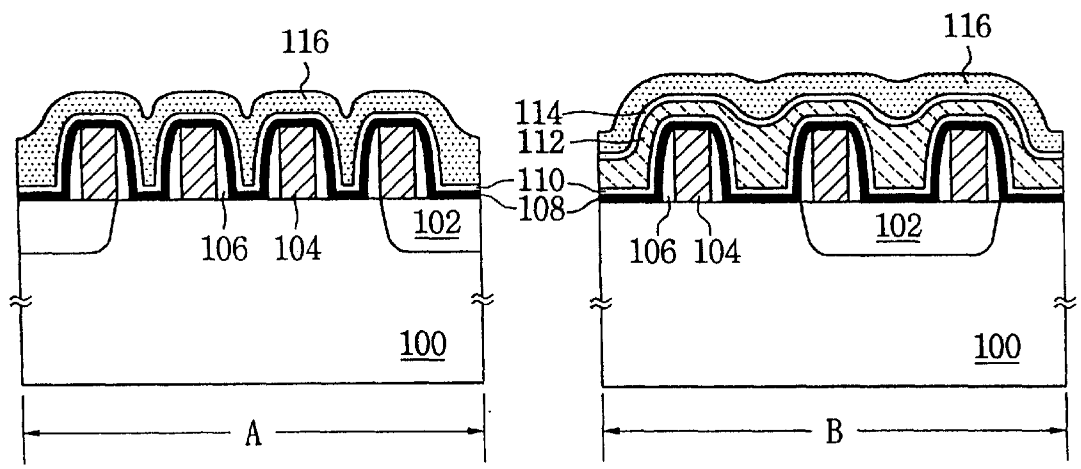

As shown in FIG. 2*e*, the second oxide film 116 for SBL of USG material is formed on the resultant material.

Figure 2F:
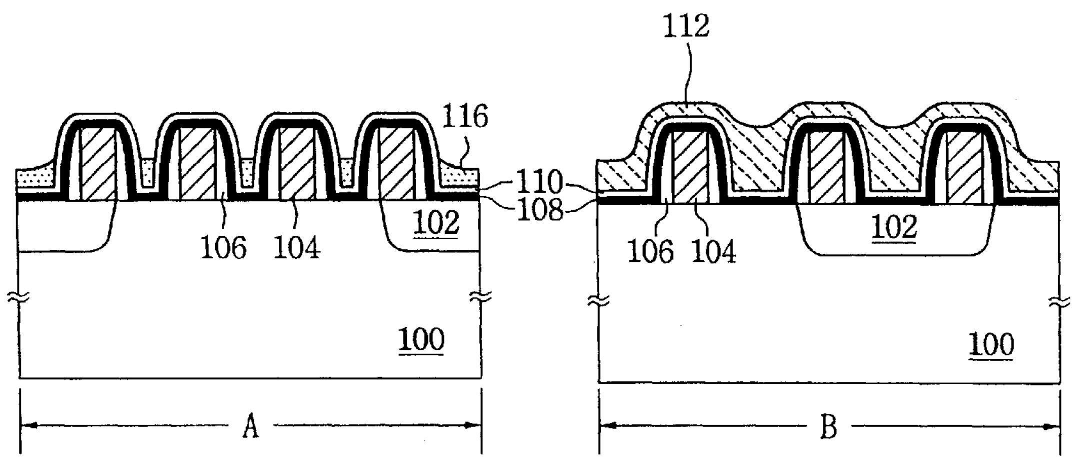

As shown in FIG. 2*f*, the second oxide film 116 for SBL is etched back by a wet etching process so that the second oxide film 116 may remain by self-alignment to a thickness of several hundreds Å or more in only the active region A in which the space between the gates is narrow. In this procedure, since the insulating film of the logic circuit forming region B is also removed, the predetermined film 112 of the logic circuit forming region B is entirely exposed if the etch back process is completed.

As described above, in the active region of the DRAM cell forming region A, the oxide film 116 having a lower step coverage than in the gate 104 remains, and in the logic circuit forming region B, the etching process is performed so that the predetermined film can be exposed. The reason is that in the logic circuit forming region B, the oxide film 116 of USG material is deposited at the state that the active region between the gates 104 is filled with the predetermined film 112 of an organic ARC material. In contrast, in the DRAM cell forming region A, the oxide film 116 of USG material is deposited at the state that the active region between the gates 104 is formed with a deep valley, thus, the thickness of the oxide film 116 that is deposited in the active region of the logic circuit forming region B is approximately two times that of the oxide film 116 that is deposited in the active region of the DRAM cell forming region A.

Figure 2G:
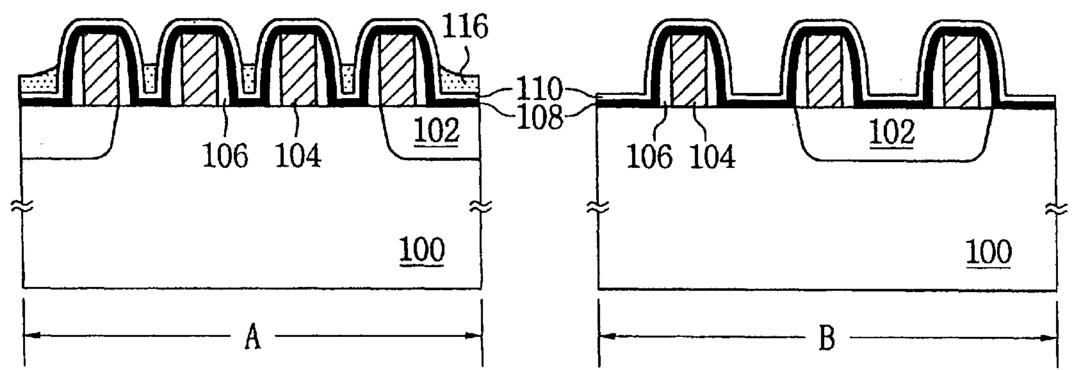

As shown in FIG. 2*g*, the residual predetermined film 112 in the logic circuit forming region B is removed.

Figure 2H:
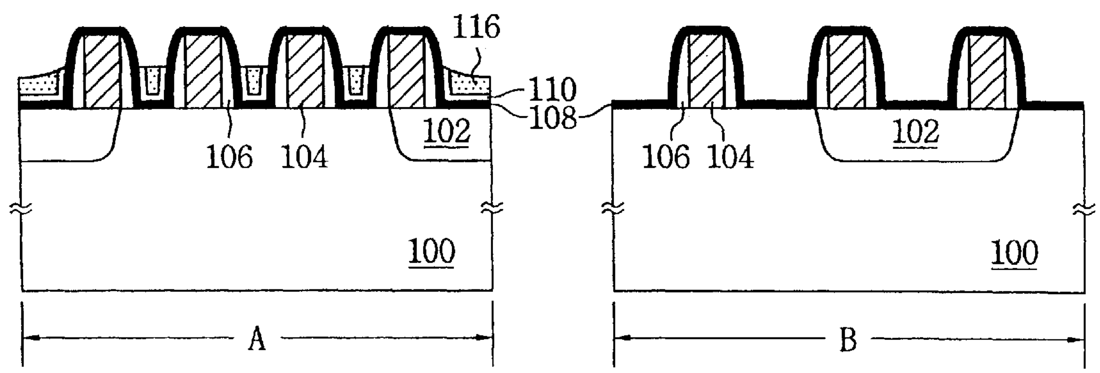

As shown in FIG. 2*h*, the whole nitride film 110 for SBL other than the active region of the DRAM cell forming region A in which the second oxide film 116 for SBL remains is dry-etched by utilizing the first oxide film 108 for SBL as an etch stopper film.

Figure 2I:
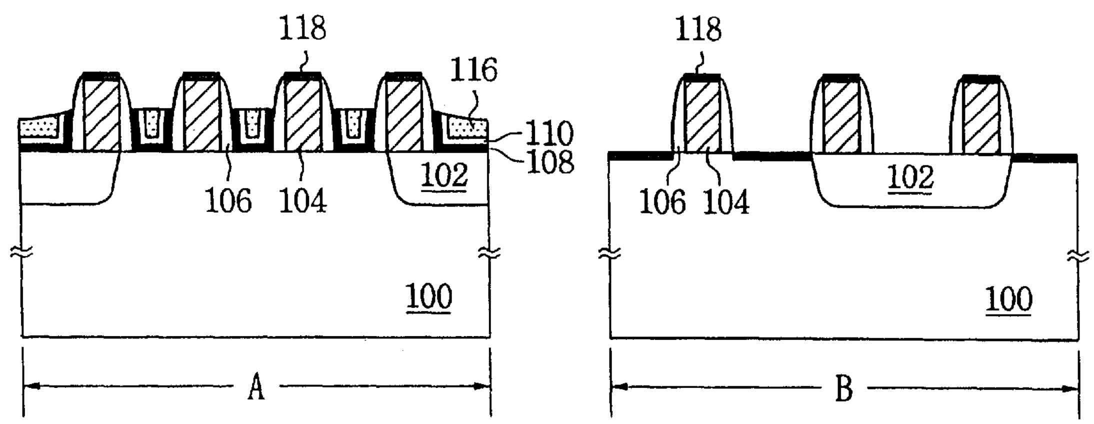

As shown in FIG. 2*i*, the other first oxide film 108 for SBL excluding the portion the second oxide film 116 is removed, thereby exposing the silicide film forming region, that is, the gate surface of the DRAM cell forming region and the surfaces of the gate and the active region in the logic circuit forming region. The refractory metals of Co, Ti and Ni are deposited on the resultant material and are heat treated.

At this time, the silicon and the refractory metals react and the silicide film 118 of low resistance is accordingly formed in the region in which the oxide film 108 is removed. In contrast, the silicon and the refractory metals cannot react and the refractory metal accordingly remains in an un-reacted state in the region in which the second oxide film 116 remains or the spacer 106 formed region. Subsequently, the remaining refractory metals are removed using sulfuric acid and the processes are completed.

In the case that the silicide film is formed as described above, the narrow valleys between the gates 104 are first filled with the organic ARC (indicated as reference numeral 112) to planarize the film. Then, only the organic ARC of the DRAM cell forming region A is selectively removed and the second oxide film 116 for SBL of USG material is deposited. As a result, the second oxide film 116 is deposited in a regular thickness in the active region of the logic circuit forming region B regardless of whether the space between the gates 104 is narrow or broad.

Accordingly, even though there exist some regions in which the space between the gates 104 in the logic circuit forming region B is somewhat narrow, the surfaces of the gate 104 and the active region in the logic circuit forming region B can be opened entirely through the processes of removing the predetermined film 112 and the first and second oxide films 108, 110 for SBL, which are performed after the etch back process of the second oxide film 116. As a result, the defect that the silicide film is partly not formed in the active region of the logic circuit forming region B can be prevented. That is, even if there exist any regions in which the space between the gates 104 in the logic circuit forming region B is somewhat narrower than in the DRAM cell forming region A, the active region of the logic circuit side can wholly be changed into silicidation state even without adding a separate photoresist patterning process.

Meanwhile, the process step illustrated in FIG. 2*i* may be performed such that the residual second oxide films 116 for SBL in the DRAM cell forming region A are removed together when the first oxide film 108 for SBL in the silicide film forming region is etched. In this case, since the oxide films of the DRAM cell forming region A and logic circuit forming region B are entirely removed, the etch stopper film of SiON material for forming a deep contact can be applied without any difficulties.

As described above, according to the present invention, an organic ARC having an excellent planarization characteristic is separately applied to the formation of the selective silicide film in addition to SBL. Accordingly, the active region of the logic side is entirely changed to the silicidation state without adding a separate photoresist patterning process, even though there exists any regions in which the space between the gates is somewhat narrower than in the DRAM cell forming region. Also, the etch stopper film of SiON material that is needed in the formation of deep contact can be applied to a MDL process having dual gate in mass production.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of selectively forming a silicide film of merged DRAM and logic (MDL), comprising the steps of:

forming gates provided with an insulating spacer in each of DRAM forming region and a logic circuit forming region on a substrate;

ion-implanting a high concentration of impurities to selectively form a source/drain region in the logic circuit forming region on the substrate;

depositing in order a first oxide film for a silicide blocking layer (SBL) and a nitride film for the SBL on the resultant material;

coating the nitride film for the SBL with a predetermined film having a constant thickness;

forming an insulating film in the logic circuit forming region on the predetermined film;

removing the predetermined film that is not masked by the insulating film in the DRAM cell forming region;

depositing a second oxide film for the SBL on the resultant material;

etching back the second oxide film so that in the active regions between the gates of the DRAM cell forming region, the second oxide film for SBL that has a lower step coverage than the gate remains, and in the logic circuit forming region, the predetermined film is exposed;

removing the residual predetermined film in the logic circuit forming region;

etching in order the nitride film for the SBL and the first oxide film for SBL exclusive of the active region of the DRAM cell forming region in which the second oxide film for SBL remains so that the gate surface of the DRAM cell forming region, the gate surface and the surface of the active region in the logic circuit forming region are exposed; and forming a silicide film on each of the gate and the active region, the surfaces of which are exposed.

2. The method as defined in claim 1, wherein the first oxide film for SBL is formed of medium temperature oxide material (MTO).

3. The method as defined in claim 1, wherein the predetermined film is formed of material that is easily removed by an ashing process.

4. The method as defined in claim 1, wherein the predetermined film is formed of an organic ARC.

5. The method as defined in claim 4, wherein the organic ARC is formed at a thickness of 300 through 4000 Å.

6. The method as defined in claim 1, wherein the insulating film is formed of at least one of PEOX and USG.

7. The method as defined in claim 1, wherein the second oxide film for SBL is formed of USG material.

8. The method as defined in claim 7, wherein the second oxide film for SBL is formed at a thickness of 2000 through 3000 Å.

9. The method as defined in claim 1, wherein the nitride film for SBL is dry-etched using the first oxide film for SBL as an etch stopper film.

10. The method as defined in claim 1, wherein the first film for SBL is etched in a wet cleaning process.

11. The method as defined in claim 10, wherein when the first film for SBL is etched, the second oxide film for SBL that remains in the active region of the DRAM cell forming region is removed at the same time.

12. The method as defined in claim 1, wherein the silicide film is formed by a method comprising the steps of:

etching the nitride film for SBL and the first oxide film for SBL and then forming a refractory metal on the resultant material and heat-treating the refractory metal, and removing the refractory metal that is not reacted.

13. The method as defined in claim 12, wherein the refractory metal is selected from the group consisting of Co, Ti, Ni.

14. The method as defined in claim 12, wherein the refractory metal that is not reacted is removed by sulfuric acid.

* * * * *